United States Patent [19]
Hamo

[11] Patent Number: 6,016,075
[45] Date of Patent: Jan. 18, 2000

[54] CLASS-D AMPLIFIER INPUT STRUCTURE

[75] Inventor: David J. Hamo, Cary, N.C.

[73] Assignee: Lord Corporation, Cary, N.C.

[21] Appl. No.: 08/869,104

[22] Filed: Jun. 4, 1997

[51] Int. Cl.[7] ....................................................... H03F 3/38
[52] U.S. Cl. ............................................. 330/10; 330/251
[58] Field of Search ................................. 330/10, 207 A, 330/251; 381/120, 121

[56] References Cited

U.S. PATENT DOCUMENTS

| | | | |
|---|---|---|---|
| 4,178,556 | 12/1979 | Attwood | 330/10 |
| 4,346,349 | 8/1982 | Yokoyama | 330/10 |
| 4,524,335 | 6/1985 | Yokoyama | 330/10 X |
| 5,131,047 | 7/1992 | Hashimoto et al. | 381/71 |
| 5,410,592 | 4/1995 | Wagner et al. | 379/388 |
| 5,523,715 | 6/1996 | Schrader | 330/10 |
| 5,574,405 | 11/1996 | Razavi | 331/2 |
| 5,802,184 | 9/1998 | Heath | 381/71.4 |

OTHER PUBLICATIONS

Article entitled "Class D Amplifiers Provide High Efficiency For Audio Systems", by Jeffrey D. Sherman, published in EDN, May 25, 1995.

Circuitry design for "TL493, TL494, TL495 Pulse–Width–Modulation Control Circuits", published by *Texas Instruments*, D2535, Jan. 1983, revised Oct. 1988.

*Primary Examiner*—Steven J. Mottola
*Attorney, Agent, or Firm*—Myers Bigel Sibley & Sajovec

[57] ABSTRACT

A Class-D amplifier using an audio signal input structure with monolithic devices forming integrated circuit configurations to receive audio input signals to be amplified. One monolithic device used to couple audio input ports to receive respective audio input signals to be amplified and feedback network to receive feedback signals is a pulse-width-modulator. Another monolithic device is used to form an integrated circuit with a pulse-width-modulated square wave input ports. Field effect transistor driver circuits are connected to respective pulse-with-modulated square wave signal input ports. Filter circuits coupled to the integrated circuits are used to receive and filter the amplified square wave signals and produce continuous amplified audio signals.

17 Claims, 9 Drawing Sheets

CLASS-D AMPLIFIER INPUT STRUCTURE

BACKGROUND OF INVENTION

1. Field of Invention

The invention relates generally to Class-D audio amplifiers and more specifically to use of a front end PWM controller integrated circuit and a single source power output stage for Class-D amplifiers.

2. Description of the Related Art

A Class-D amplifier, also known as a switching amplifier, is an amplifier that switches at a high frequency, generating a high-voltage rectangular waveform at its output. This rectangular waveform can be modulated with a low-voltage signal within the audio bandwidth. The modulation results in a pulse width modulated (hereinafter referred to as "PWM") waveform at its output. Field effect transistor (FET) circuitry produces a high voltage PWM waveform, which is filtered with a passive inductor capacitor (LC) filter to remove the high-frequency carrier waveform and reconstruct the high-voltage, low-frequency waveform from the modulation input command. The filtered high-voltage waveform is now in the audio bandwidth and when applied to a speaker will produce sound.

Presently and in the past, developers implementing Class-D audio amplifiers have done so by using discrete circuitry such as op-amps, comparators, etc. Discrete circuitry has typically been considered essential to generation of a low distortion audio signal output.

Figure 1:
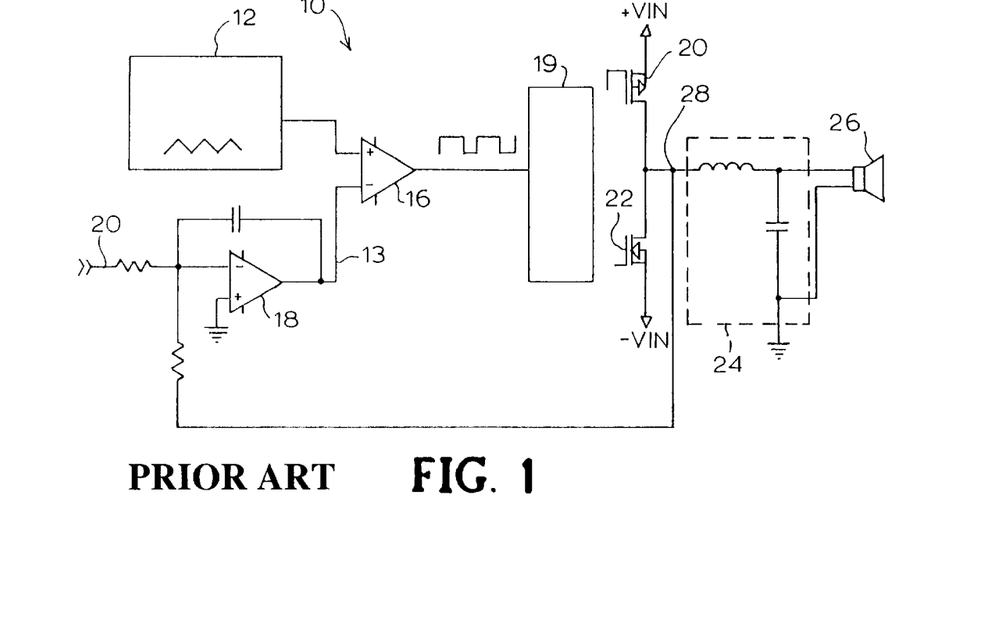
FIG. 1 is a schematic diagram of the Classic Half-Bridge Class-D Amplifier.

FIG. 1 illustrates the Classic Half-Bridge Class-D audio amplifier 10 using discrete components to generate the PWM output. A triangle wave generator 12 creates a triangle waveform carrier frequency. The triangle waveform sets the resulting switching frequency of the amplifier and is typically greater than ten times the audio frequency bandwidth, 200 KHz. Conventional voltage comparator 16 compares the triangle waveform with the error signal to produce a PWM output signal. The error signal is formed by the error amp 18 when the command input signal (audio input) at 20 is compared with the actual signal taken from the output at junction 28. The control-loop response of the system determines how quickly the output can respond to the input command and produces the error signal. The error signal is proportional to the difference between the audio input signal and the actual signal at the output. The PWM signal from the comparator 16 is then sent to a field effect transistor (FET) driver integrated circuit 19 that drives the output FET's 20, 22. The FET's consist of an upper P-channel output FET 20 and a lower N-channel output FET 22. The P-channel FET switches a bus voltage supplied from +VIN and the N-channel FET switches a bus voltage supplied from −VIN to produce a high-voltage PWM waveform that is filtered by the LC filter 24 to reproduce the audio signal at the speaker 26.

Figure 2:
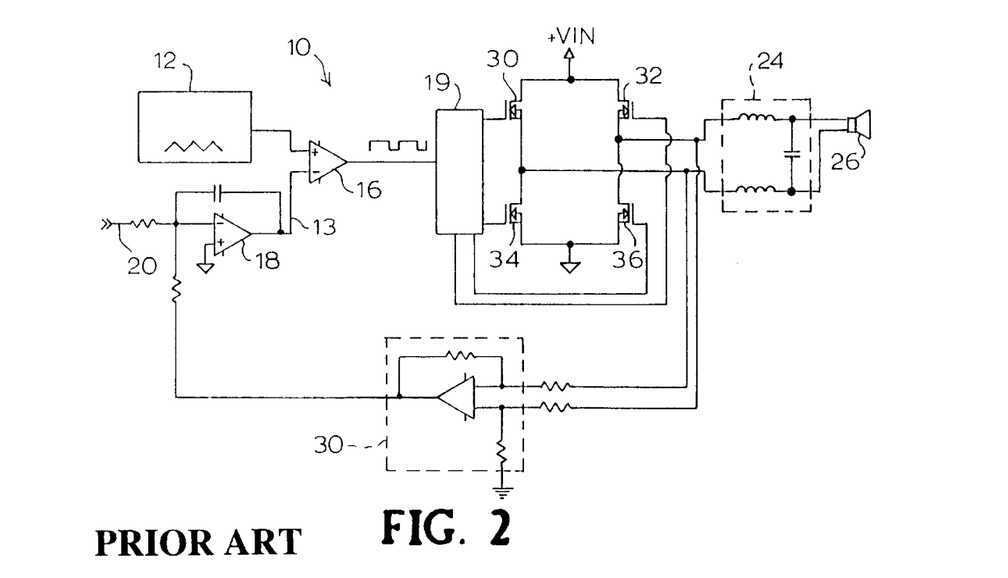
FIG. 2 is a schematic diagram of the Classic Full-Bridge Class-D Amplifier.

A half-bridge topology is shown in FIG. 1 for simplicity, however, this concept can be extended to a full-bridge topology using four N-channel FETs 30, 32, 34, and 36 as shown in FIG. 2. The full-bridge topology as shown in FIG. 2 requires a positive power supply. FIG. 2 shows a single power source +VIN. Full-bridge topology requires an increase in discrete components. In addition to the triangle wave generator 12, comparator 16, and error amp 18, full-bridge topology requires a differential amp 30, which requires more complex output signal processing for the feedback circuit. In operation, the differential amp 30 receives the differential signal and produces therefrom an output signal to combine with the audio input signal. The topology chosen is determined by the output power requirements of the amplifier. Higher power amplifiers, those greater than 200 watts, will typically use a full-bridge topology. An LC filter 24 is adapted to filter the differential output to reproduce the audio signal at speaker 26.

Present Class-D amplifier devices do not use integrated control chips having triangular (or sawtooth) waveform generators, comparators, and error amps to produce a PWM signal. Traditional Class-D amplifiers are described in the May 25, 1995 EDN publication entitled *Class D Amplifiers Provide High Efficiency For Audio Systems,* by Jeffrey D. Sherman, and is hereby incorporated by reference. Traditional Class-D amplifier technology uses discrete components to produce audio output signals having low total harmonic distortion (THD), low intermodulation distortion (IMD), and the like. Discrete components also provide control of over-current limiting, thumping during turn-on and turn-of, soft clipping, and further provides discrete operational amplifiers used to process feedback signals, and accomplish other basic signal processing functions. However, use of discrete operational amplifiers requires additional circuit space requirements, and add considerable cost to the design of the Class-D amplifier. In addition, as shown in FIG. 1, the half-bridge Class-D amplifier requires a dual power supply having an upper positive and lower negative power supplies. The positive power supply requires use of an expensive P-channel FET in the upper leg. As a result of the substantial amount of discrete components currently used in current Class-D amplifiers, the cost of Class-D amplifier designs have been prohibitive for high-volume consumer applications such as multimedia, PC-TV, home theater, automotive and general consumer applications.

It is therefore an object of this invention to provide a novel input structure in a Class D-Amplifier comprising an integrated controller circuit to simplify Class-D amplifier circuitry and to minimize the use of expensive discrete components.

It is an object of this invention to provide a novel output structure in a half-bridge Class-D amplifier including a single positive power supply, two N-Channel FET's, and a coupling capacitor placed prior to or after a LC filter.

It is an object of this invention to eliminate the expensive P-channel FET for the Half-Bridge Class-D Amplifier Design.

It is another object of this invention to provide a simplified and low cost Class-D amplifier for high-volume consumer applications.

SUMMARY OF INVENTION

The Class-D amplifier of the present invention uses a switching power supply PWM controller integrated circuitry to produce a PWM waveform. PWM controllers are generally used in the switching power supply industry to change one direct current (DC) voltage to another DC voltage, but have not been used in switching amplifier circuits. Switching power supply PWM controller integrated circuits contain all the internal components necessary for implementation in Class-D amplifier circuitry as recognized by the present invention. However, the PWM controller includes features that are not immediately ideal for use in an audio amplifier environment. The term non-ideal is meant to include such specifications as op-amps frequency limitations, op-amp noise, and the voltage reference noise, gain-bandwidth product limitations, and sawtooth, oscillator, non-linearities, etc. The circuitry of the present invention works, however, because of the control-loop of the invention linearizes the overall system. If the non-ideal components are within the control loop, the non-ideal performance of these elements will be eliminated. Use of PWM controller integrated circuits reduces the complexity, cost and size of Class-D amplifiers, yet produces a audio output signal having low distortion.

The Class-D amplifier of the present invention also uses a coupling capacitor in conjunction with a single positive power supply to facilitate the use of N-channel FETs in a half-bridge design. Therefore, the present invention also eliminates the need for a dual power supply and the relatively expensive upper P-channel FET, as traditionally used in half-bridge Class-D amplifier technology.

DETAILED DESCRIPTION OF THE INVENTION

The Class-D amplifier of the present invention uses PWM controller integrated circuitry and a coupling capacitor in conjunction with a single positive power supply, significantly reducing the complexity, cost, and bulkiness of traditional Class-D amplifiers, shown in FIGS. 1 and 2. Numerous different low-cost power supply PWM controller chips may be used in Class-D amplifiers, generating very acceptable results. PWM controller chips are integrated chips incorporating the components necessary for application in a Class-D system, and would include any monolithic device forming an integrated circuit adapted for such an application. In some cases these results out-perform discrete designs with full power THD levels far below 0.5%. Thus, using PWM controller integrated circuitry of the invention, 20 to 100 watt full-range amplifiers can be produced in high volumes at significantly less cost than the discrete circuit Class-D amplifier counterparts. PWM controllers capable of being used in the present invention are voltage-mode PWM controllers from Texas Instruments (including PWM controller Item Nos. TL5001, TL494, TL1451 and TL1454. However, other PWM controller chips from other manufacturers will work. Voltage mode, current mode, hysteric mode, resonant mode, average current mode, current-fed, voltage-fed and synchronous PWM controllers may also be used in the present invention. These PWM controllers will include but are not limited to the control of half-bridge, full-bridge, forward, flyback, push-pull, full-bridge resonant, half-bridge resonant, current-fed and voltage-fed topologies. In addition, many motor-control PWM controllers will work for subwoofer amplifier designs where the switching frequency needs only be in the 20 KHz range. High efficiency, synchronous, step-down controllers of the type made by Unitrode (Item Nos. UC1870-1,-2, UC2870-1,-2, UC3870-1,-2) which incorporate the FET drivers are also acceptable integrated devices capable of use in the present invention.

The power supply PWM controllers used in the present invention incorporate all the components necessary for application in a half-bridge, full-bridge, and stereo Class-D amplifier systems. In summary, the PWM controller used in the present invention includes at least two internal op-amps. One can replace the discrete error amplifier shown in FIGS. 1 and 2. The other PWM controller op-amp can be used for over-current or short circuit protection. This can be done by setting one input of the second op-amp to a threshold voltage while the other input monitors the FET current through a resistor. When the threshold is reached, the second op-amp will shut-off the PWM. The PWM controller may have additional circuitry that will try to restart the system after some period of time.

Power supply PWM controllers also include some form of comparator to compare the triangle or sawtooth generated signal to the error amp signal. This comparator may have additional digital logic around it to provide blanking. Blanking simply limits the maximum duty cycle of the output drivers. Those PWM controllers without blanking usually allow a maximum duty cycle of 100%.

The internal voltage reference of the power supply PWM controller can be tied to the non-inverting input of the PWM controller error amp to create a 50% duty cycle when there is no audio input voltage. The inverting input to the error-amp is the summing junction of the feedback signal and the audio input signal. When the system is scaled properly, a 50% duty cycle square wave signal results at the output when there is no audio input voltage. As a result there will be no audio voltage across the speaker as indicated by the following equation:

$$Vout=(2D-1) \times Vin$$

Where D=duty cycle, Vin=Input bus voltage and Vout=output voltage to the speaker.

The internal oscillator of PWM controller is set with a simple resistor and/or capacitor combination. This oscillator will set the carrier frequency to 200 KHz and above for full-range amplifiers or to 20 KHz and above for sub-woofer amplifiers.

Figure 5A:
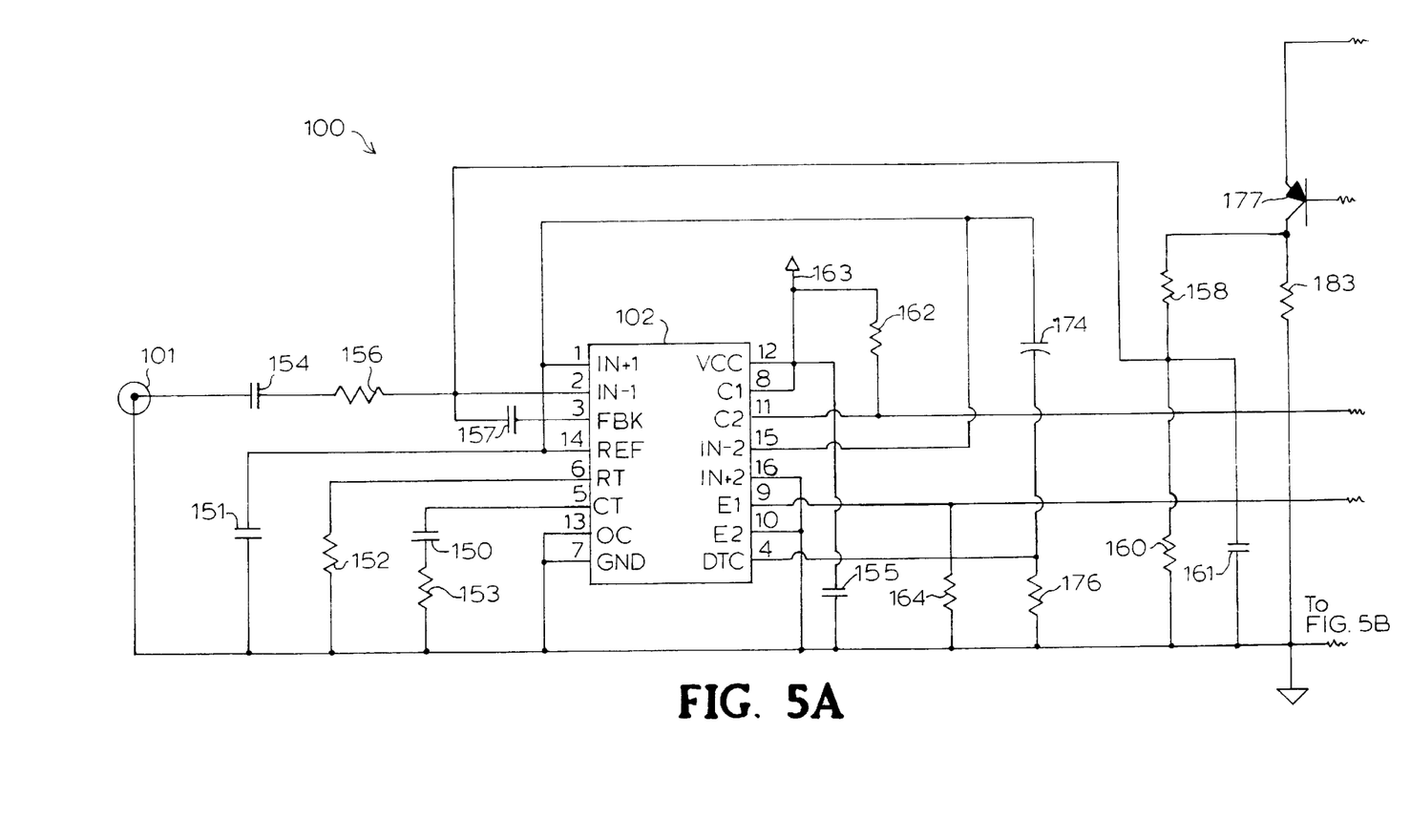
FIGS. 5A and 5B are detailed schematics of the Half-Bridge Class-D Amplifier illustrated in FIG. 3.
Figure 5B:
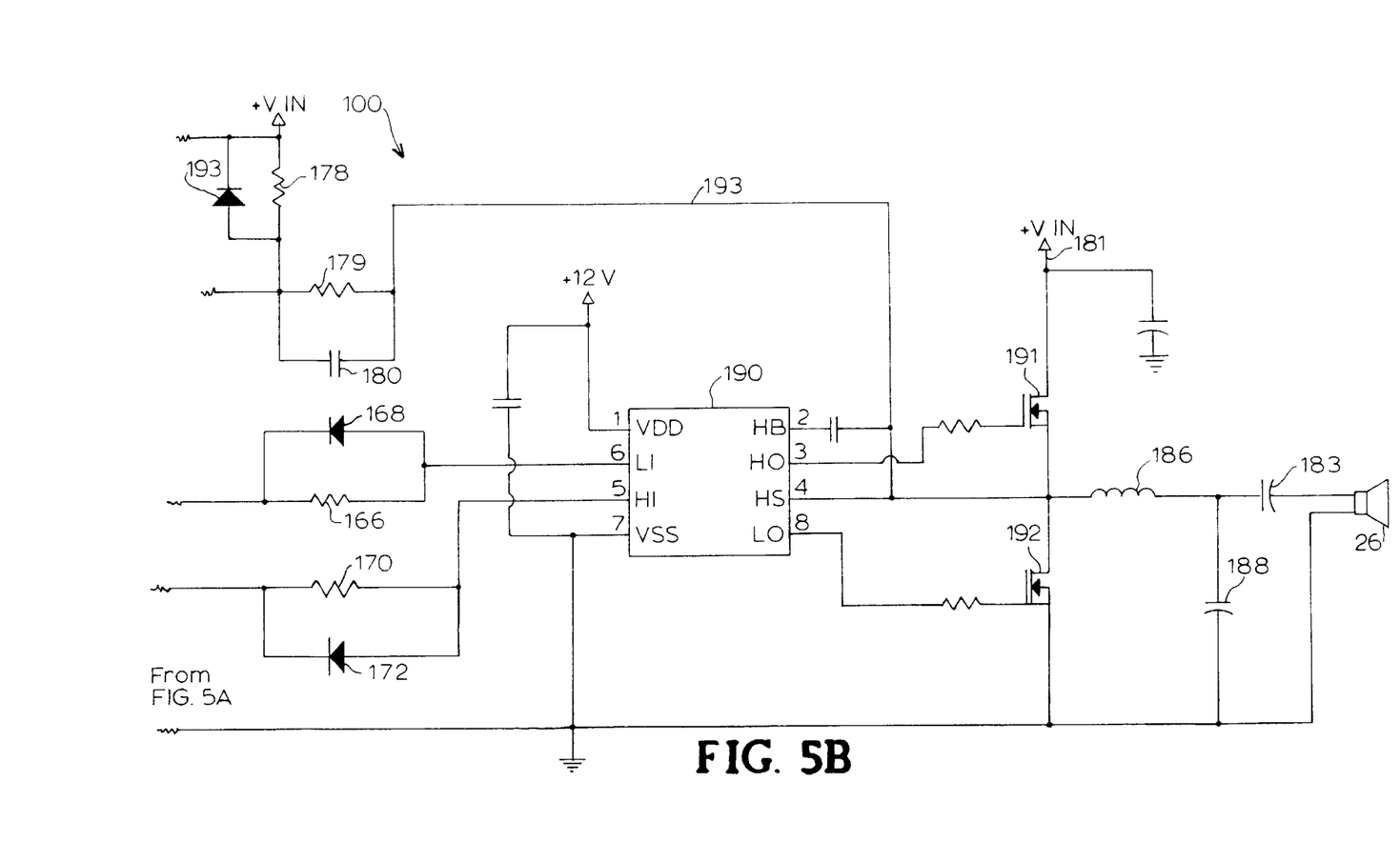

Power supply PWM controllers also include output drivers, which come in single ended, push-pull, parallel or synchronous operation. The single ended output can be used to drive FET driver devices such as HARRIS SEMICONDUCTOR's HIP4081 or HIP4080. The parallel operated drivers like that on the TEXAS INSTRUMENT's TL494 can be use to drive HARRIS's HIP2100 FET driver. The implementation shown in FIG. 5 uses a parallel output to drive the HARRIS HIP2100.

Nearly all of the recent PWM controllers have slow start or dead time control (DTC). This is a very useful feature for providing anti-transient capability to the amplifier. This feature will prevent speaker thumping during the turn-on and turn-off of the supply voltage. This is accomplished by keeping the lower FET on in the half-bridge design and both lower FET's on in the full-bridge during power on. At the same time, applying the proper voltage to the DTC to keep the device from switching then slowly change the DTC input appropriately to increase switching slowly. A simple resistor capacitor (RC) filter is all that is required for DTC during power on-off. This will provide anti-thumping at virtually no cost.

Figure 3:
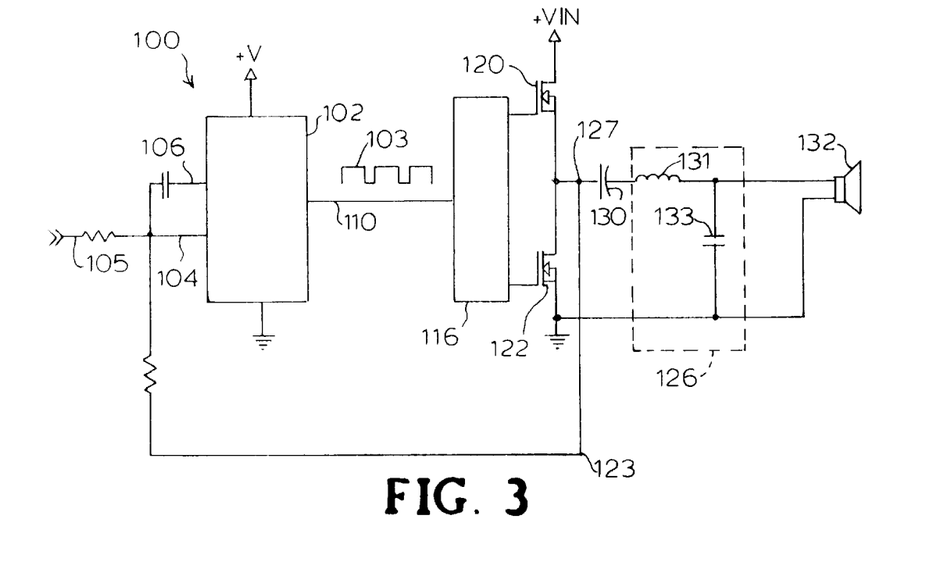
FIG. 3 is a schematic diagram of a simplified low cost Half-Bridge Class-D Amplifier using a PWM integrated circuit at the front end and a pair of N-channel FETs and a coupling capacitor at the output structure.

Referring now to FIG. 3, a simple block diagram illustrating in summary form the present invention 100 with half-bridge topology. The half-bridge Class-D amplifier of the present invention 100 includes a PWM controller 102. PWM controller 102 receives audio input signal 105 and a feedback signal corresponding to the actual signal taken at junction 127 and transmitted along line 123 to 104. The actual output signal is fed back in FIG. 3, before it is filtered by LC filter 126, which is comprised of capacitor 133, and inductor 131. PWM controller 102 generates a triangle or sawtooth signal (depending on the PWM controller used) which is compared to an error signal formed by an error amp within PWM controller 102. The error amp produces an error signal from the difference between the audio input signal at 105 and the output feedback signal. This error signal is then compared with the triangle waveform by an internal comparator producing a PWM output signal illustrated as waveform 103 at output 110, which is transmitted to the PWM square wave signal input port of a field effect transistor (FET) driver 116. FET driver 116 includes two square wave signal output ports and two field effect transistor driver circuits (not shown). FET driver 116 drives theFET operated switching circuit comprising the upper and lower N-Channel FET's 120, 122. Upper FET 120 and lower FET 122 switch between +VIN and ground to produce a high-voltage PWM waveform transmitted to LC filter 126. Capacitor 130 blocks the DC component of the half-bridge operating with a single positive power supply, whereas LC filter 126 removes carrier waveform coupling the alternating current (AC) audio output signal to speaker 132. The control loop can be taken either before or after the LC filter. Taking the actual output signal before LC filter 126 as illustrated in FIG. 3, is the easiest approach. However, when this is done, any non-linearities in LC filter 126 will not be eliminated, since the filter is outside the control loop. Taking the feedback signal after LC filter 126 solves this non-linearity problem, but makes closing the control-loop more formidable, because of the additional poles the LC filter 126 introduces. If the coupling capacitor is placed after the inductor, the filter capacitor of the LC filter can be a low-cost electrolytic. This is because at the point where the LC filter components connect, the audio voltage signal will be centered around ½ the bus voltage. Consequently, the electrolytic LC filter would not see a polarity reversal as it would if the coupling capacitor were placed before the LC filter. If the coupling capacitor is placed before the inductor the capacitor of the LC filter must be a non-polarized capacitor capable of handling polarity reversal, usually a film type, which is much more expensive than an electrolytic. Thus, there are significant cost advantages to a coupling capacitor located after the LC filter in the Class-D amplifier 100 of the present invention. What's more, placing the coupling capacitor before or after the LC filter means that one end of the speaker can be grounded. This is a very important feature for the automotive markets.

Figure 4:
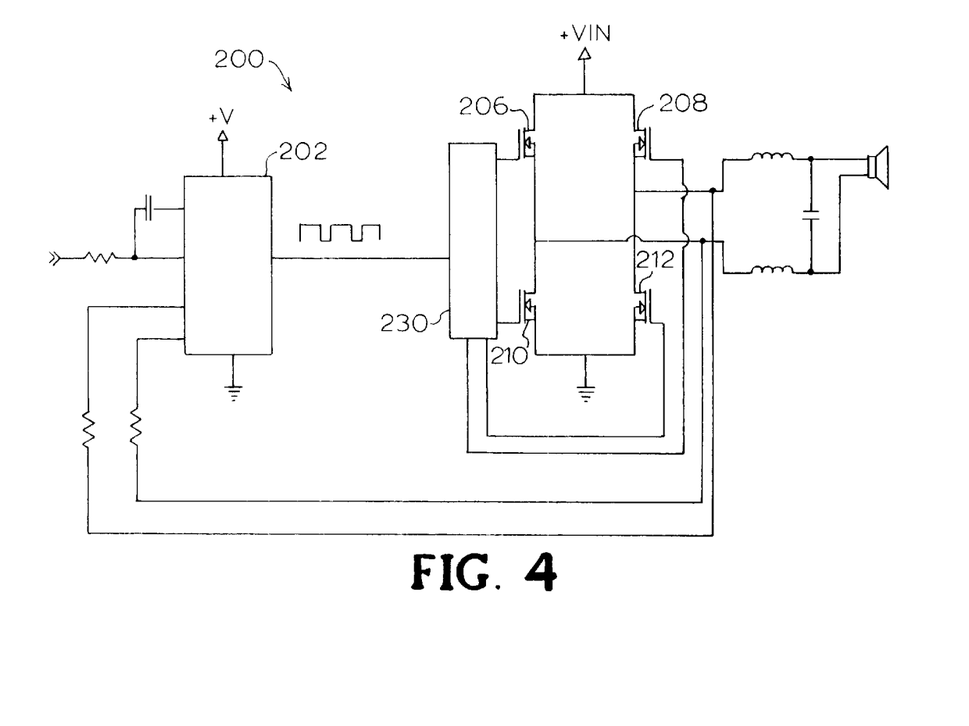
FIG. 4 is a schematic diagram of a Full-Bridge Class-D Amplifier of the present invention.

FIG. 4 is a simple block diagram illustrating the summary form of a full-bridge Class-D amplifier. Full-bridge Class-D amplifier 200 uses a single +VIN. The full-bridge circuit of FIG. 4 will be described in more detail below.

The PWM Controller

FIGS. 5A and 5B illustrate the half-bridge Class-D amplifier illustrated in FIG. 3 in more detail. The Class-D amplifier of the present invention 100 includes a PWM controller 102 to replace the discrete components shown in FIGS. 1 and 2. The internal components of PWM controller 102 are not shown. However, a PWM control circuit of the type used in the present invention is manufactured by TEXAS INSTRUMENTS. TEXAS INSTRUMENTS publication D2535, January 1983, revised October 1988 entitled TL493, TL494, TL495, *Pulse-Width Modulation Control Circuits* includes a complete functional block diagram of the PWM controller of the type used in the present invention, and is hereby incorporated by reference. The PWM controller used in the present invention includes, in integrated form, the discrete components used in traditional Class-D amplifiers to produce a PWM output signal.

Referring to FIG. 5A, the Class-D amplifier of the present invention includes capacitor 154, which AC couples the audio input signal at 101 and shifts the signal up and references it to the PWM controller reference 102 at pin 14. Audio input signal 101 also passes through summing resistor 156. Capacitor 150 and resistor 152 set the internal PWM controller sawtooth oscillator to 200 KHz. Resistor 153 increases the maximum duty cycle to approximately 95%. PWM controller error amplifier input pin 2 receives the audio input signal through resistor 156. The feedback output signal from the feedback control loop is summed with the input signal via resistors 158, 160, 161, and capacitor 157. PWM controller 102 includes an internal comparator (not shown) which compares the sawtooth signal generated by the internal saw-tooth generator and the error signal from the error amplifier to generate a PWM signal. The error amplifier noninverting input pin 1 is connected to a 5V voltage reference on 102. Pin 12 is connected to Vcc. Pin 14 of PWM controller 102 is connected to an internal 5 volt voltage reference regulator.

PWM controller 102 further includes an internal output driver 1 having its collector and emitter at pins 8 and 9 respectively, and an internal output driver 2 having its collector and emitter at pins 11 and 10 respectively. The PWM controller 102 output pins 11 and 9 are configured as open collectors and are operated as parallel drivers set by the PWM controller 102 output control pin 13. Output driver 1 is configured as an emitter follower, while output driver 2 is configured as a common emitter. In this way, when the PWM signal at output pin 11 is high, the PWM signal at output pin 9 is low, and visa versa. Resistor 162 is located between the +12V power source and the collector of output driver 2, whereas resistor 164 is connected between the emitter of output driver 1 and ground.

The Single Power Supply of the Invention

FIG. 5B illustrates PWM controller 102 output signals at pins 11 and 9 transmitted to a turn-on delay circuit comprising resistor 166 in parallel with diode 168, and resistor 170 in parallel with diode 172 and input capacitance of FET driver 190 of the type manufactured by HARRIS SEMICONDUCTOR (Item No. HIP2100). The charge path is through resistors 166, 170, while the discharge path is through diodes 168, 172. This causes a turn-on delay for each FET, i.e., a dead-time between activation of FETs 191, 192, which prevents FETs 191, 192 from being energized simultaneously. When input of FET driver 190 at pins 6 is high and 5 is low, the lower FET 192 is energized. When input at 5 is high and 6 is low, upper FET 191 is energized. FETs 191, 192 are connected to a single +VIN power supply at 181 through upper FET 191. Lower FET 192 is connected to ground. Therefore, during normal operation, FETs 191, 192 switch between +VIN at 181 and ground to produce a high-voltage PWM waveform at 0V to +VIN. The high-voltage PWM signal passes through LC filter formed by inductor 186 and capacitor 188 generating a sine wave signal at 0V to +VIN. Capacitor 183 shifts the sine wave to generate a positive and negative amplified audio output voltage signal for driving speaker 26. Any modulating input command at audio input 101 will cause the rectangular output waveform to modulate at FET's 191 source and FET's 192 drain. As stated above and as illustrated in FIG. 5, the single power supply at 181 of the present invention allows use of two N-channel FETs, instead of using an upper P-channel FET and lower N-channel FET as used in traditional Class-D amplifiers. The half-bridge Class-D amplifiers operate well on amplifier applications of up to 200 watts.

Feedback Loop and Anti-Thumping

Referring again to FIGS. 5A and 5B, as stated above, the feedback control loop of the present invention, linearizes the non-linear (undesirable) characteristics of PWM controller input structure of the Class-D amplifier of the present invention. The amplified PWM output feedback signal is taken before the LC filter. The output signal is transmitted along line 193 and inverted by transistor 177. The inverted signal is then scaled down by the resistive divider formed by resistors 158, 160. The inverted scaled down signal becomes the feedback signal which is connected to pin 2 of PWM controller 102. The feedback signal is inverted to realize the correct phase in order to yield less turn-on thumping, as described below. Thus, any non-linearities caused by the PWM controller are fully compensated for.

The anti-thump circuit is comprised of capacitor 174, resistor 176, and an invertor formed by transistor 177, resistors 178, 179, 183, capacitor 180 and diode 193. During power up the DTC control input pin 4 of PWM controller 102 will see a 5 volt signal which will slowly decay toward zero. During this time the output drivers 1 and 2 will be off at pins 11 and 9 to input pins 6 and 5 of FET driver 190 (HIP2100), pin 11 will be high, pin 9 will be low, respectively. When the imput of FET driver 190 at pin 5 is low and FET driver 190 input at pin 6 is high, lower FET 192 is activated, whereas the upper FET 191 is off. When the DTC input voltage decays after power-up, the PWM controller 102 will begin switching and its output pulse width will slowly increase at a controlled rate. Once the RC circuit has fully discharged the feedback control loop formed by resistor 156, capacitor 157, resistors 158, 160, and capacitor 161 and the internal error amplifier of PWM controller having input pins 1 and 2 and output pin 3 will take over. Since the lower FET was grounded during this time no voltage was across the speaker at power-up. Because PWM controller 102 began switching slowly at a controlled rate, there was no thump during turn-on.

Full-Bridge

Figure 6A:
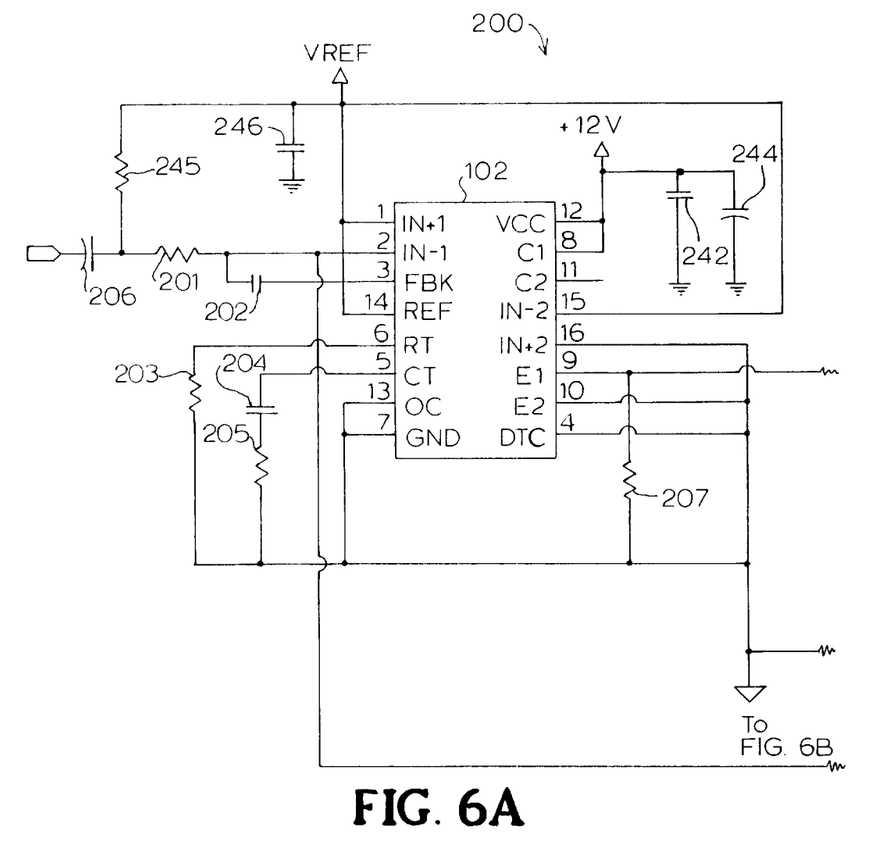
FIGS. 6A, 6B, and 6C are detailed schematics of a simplified Low-Cost Full-Bridge Class-D using a PWM integrated circuit at the front end.
Figure 6B:
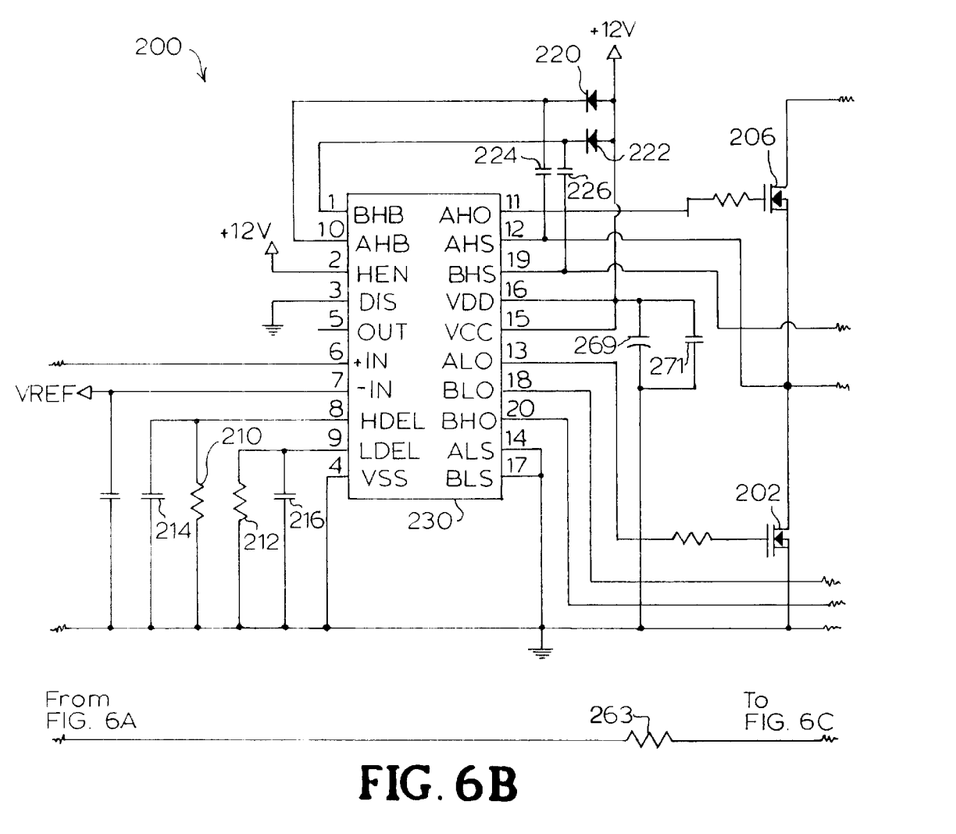
Figure 6C:
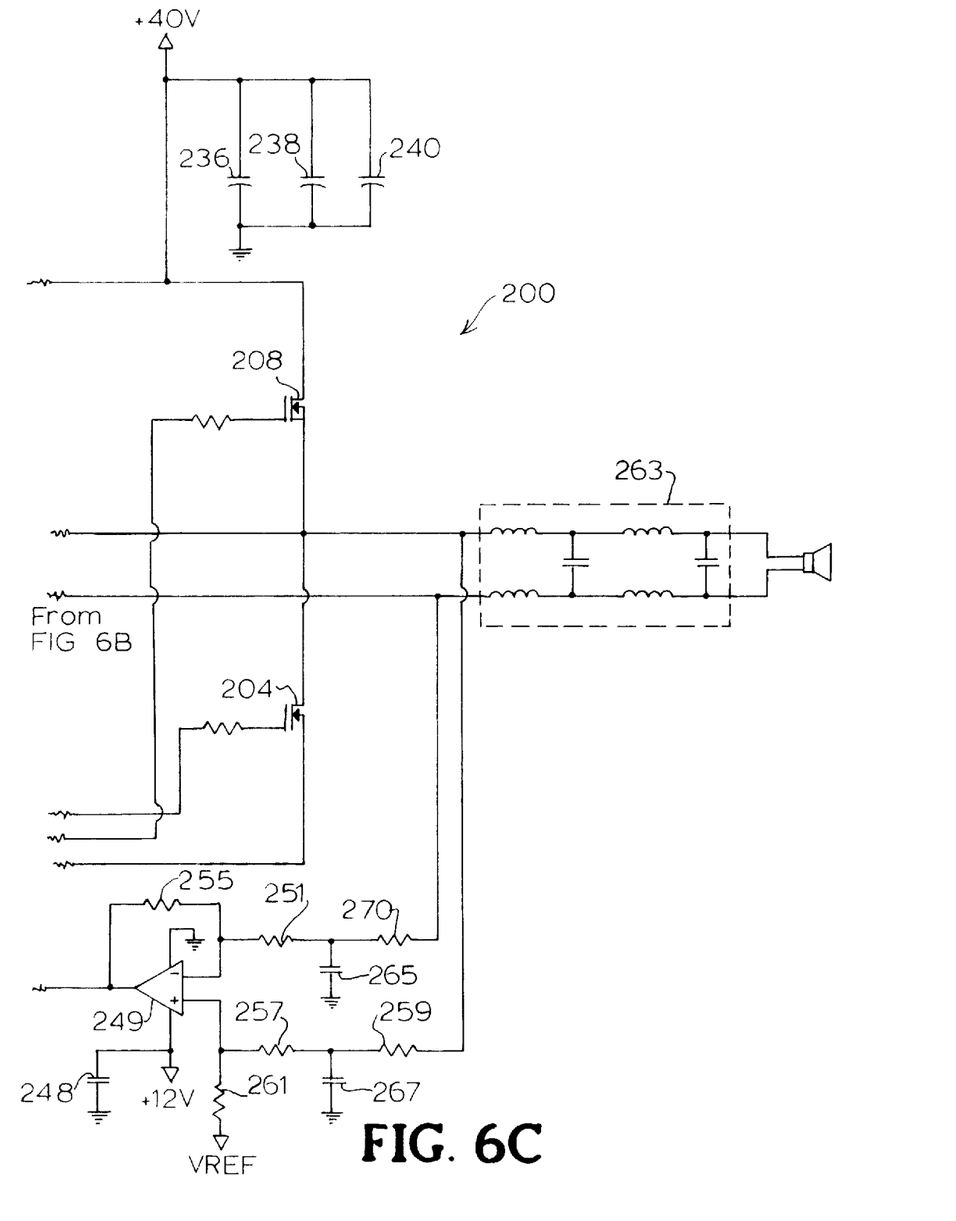

FIGS. 6A, 6B, and 6C illustrate a Class-D amplifier circuit 200 utilizing full-bridge circuitry for amplifiers greater than 200 watts. The full-bridge amplifier also uses the PWM controller 102, greatly simplifying Class-D amplifier design. Since operation of the PWM controller 102 in the Class-D amplifier half-bridge environment is discussed above, its operation in a full-bridge Class-D amplifier is merely summarized. The PWM controller works similar to the half-bridge Class-D amplifier design, in that, the full-bridge topology must hold the output signal to 50% duty cycle in the absence of an input signal. The difference is resistor 245 added to aid the output in reaching 50% duty cycle quickly when there is no input signal. In addition, only one of the outputs is used to control the full-bridge instead of both as in the half-bridge Class-D amplifier circuit of the invention. This is because the FET driver 230 controls both halves of the bridge with one input signal from pin 9 of PWM controller 102 to pin 6 of FET driver 230.

Pins 6 and 7 of FET driver 230 are the inputs to the internal comparator. The minus input at pin 7 of the internal comparator is tied to the 5V reference from the PWM controller. If pin 6 of FET driver 230 is above 5V, FETs 204, 206 are on while FETs 208, 202 are off. If pin 6 of PWM controller 102 is below 5V, FETs 204, 206 are off while FETs 208, 202 are on.

Resistors 210, 212 set the dead-time of the FET drivers so that neither upper or lower FETs will be on at the same time. Capacitors 214, 216 improve THD by eliminating noise pickup on pins 8 and 9 of FET driver 230.

Diodes 220, 222 and capacitors 224, 226 supply the FET driver 230 at pins 11 and 20 with its drive voltage. When the center of each half of the bridge is low, diodes 220, 222 are forward biased and charge their respective capacitors, 224, 226, respectively. When the upper FETs 206, 208 are driven voltage on the capacitors 224, 226, floats to 12V above the FET source voltage to turn on the upper FETs 206, 208.

The output filter 263 in this case is a dual stage (four pole) instead of a single stage. This improves total harmonic distortion numbers (THD). Op-amp 249 is configured as a differential amplifier that processes and scales the output signal before feeding it back to the error amplifier. The gain is set by resistors 251, 270 in combination with resistor 255 and 257, 259 in combination with 261. Capacitors 265 and 267 aid in filtering the large square wave PWM signal from the output and effects the control loop response slightly by adding a delay in the feedback path. The output of this amplifier coupled with summing resistor 262 is then fed back to the error amp within the PWM controller 102. The external op-amp used and configured as stated above may not be needed if there is an available op-amp within the PWM controller 102 that can be configured as a differential amplifier, further reducing complexity and cost of the system.

Capacitors 236, 238, and 240 decouple the supply inductance from the full-bridge power circuit. Other de-coupling capacitors include 242, 244, 246, 269, 271 and 248.

Figure 7A:
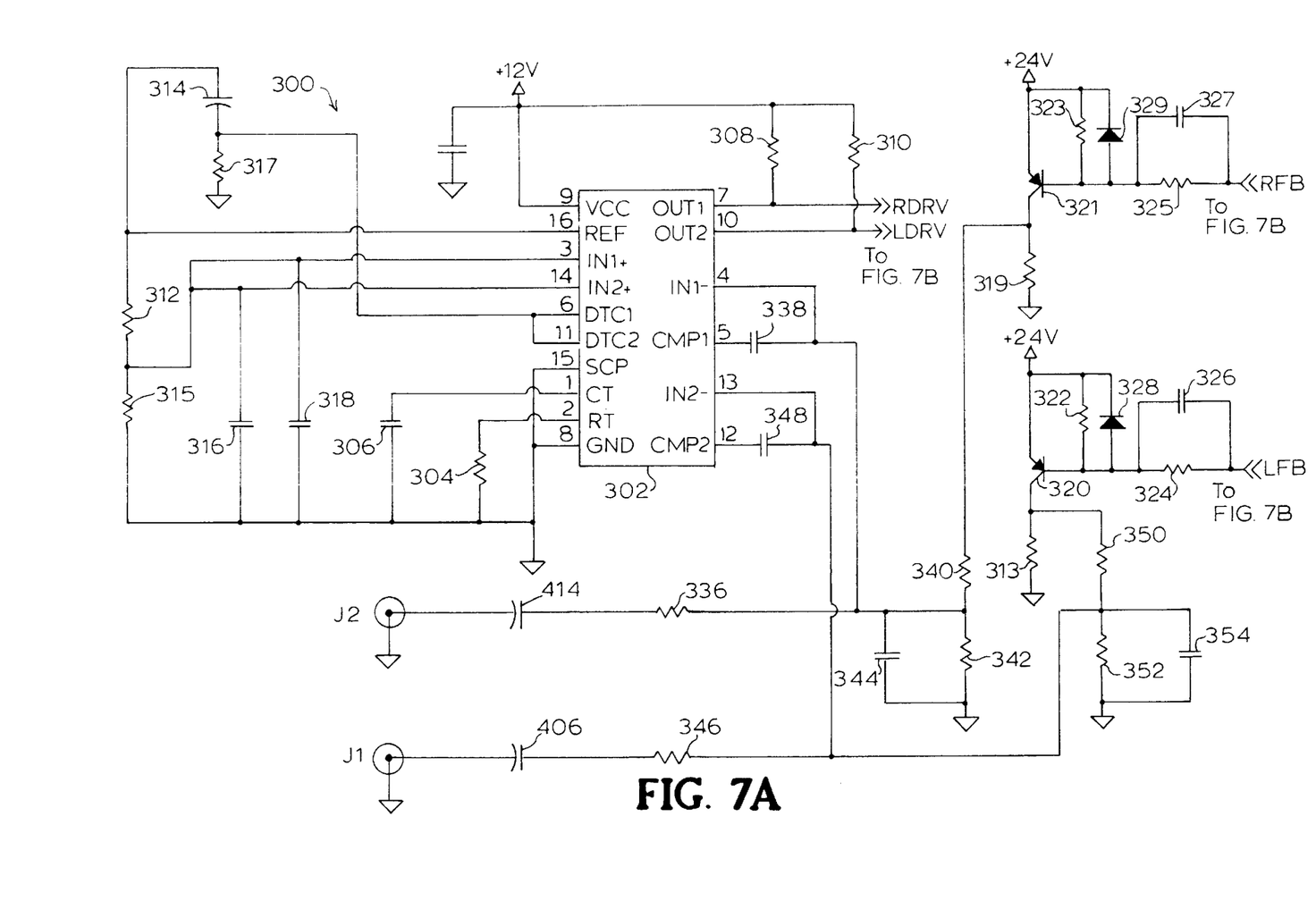
FIGS. 7A, 7B and 7C are detailed schematics of a Class-D amplifier using a monolithic integrated circuit at the front end to control two separate channels.
Figures 7B, 7C:
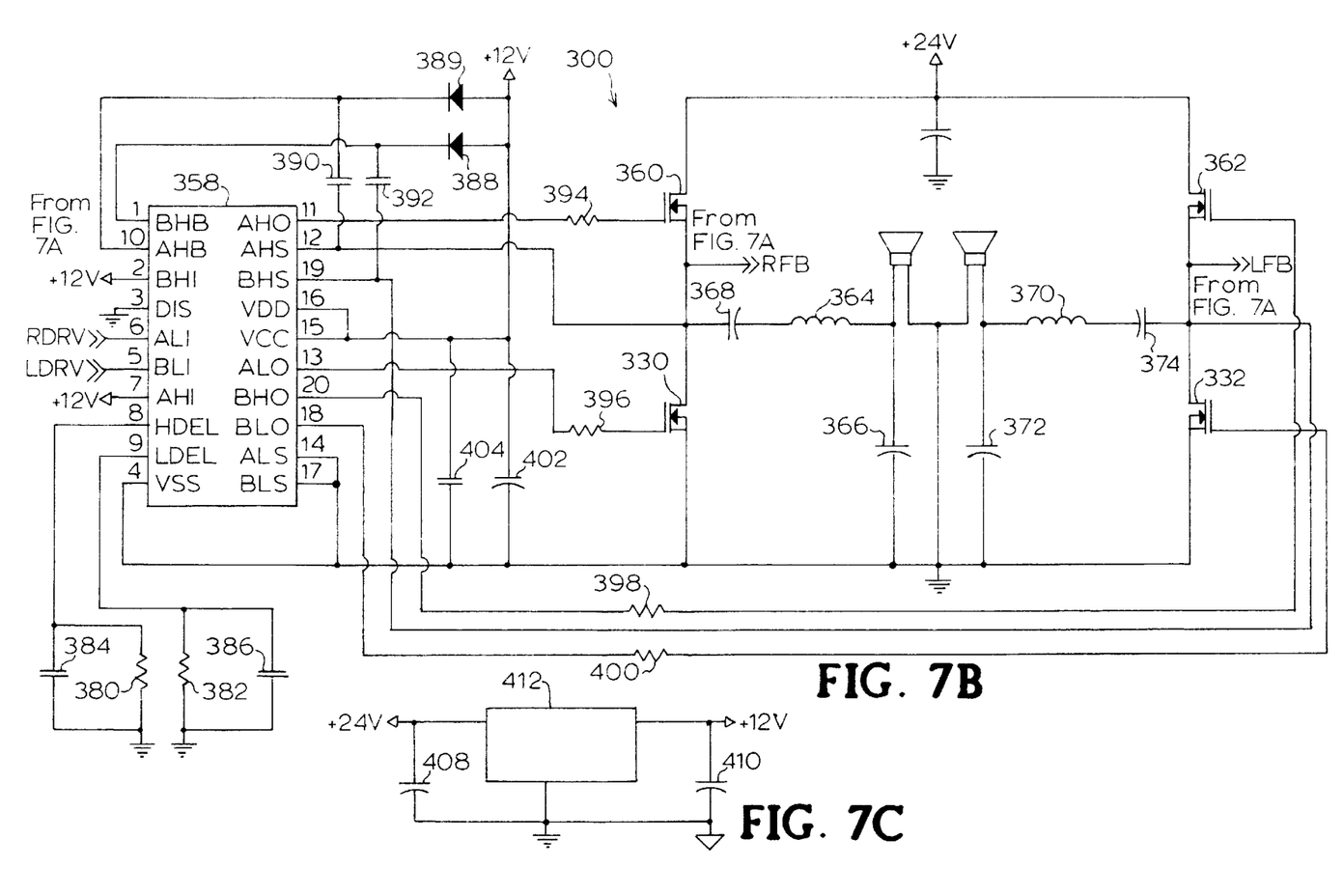

Referring now to FIGS. 7A and 7B, monolithic integrated device of the type described below can also control two separate Class-D audio amplifier channels, namely the right and left channels. FIG. 7A illustrates a PWM controller chip 302 of the type used for controlling two separate channels. Such a controller chip includes two internal PWM controllers. Controller chip 302 of the type used in the present invention is manufactured by TEXAS INSTRUMENTS (Item No. TL1451). Resistor 304 and capacitor 306 sets the carrier frequency to approximately 200 KHz. The two output ports at pins 7 and 10 are configured as open collectors and are operated independently. Internal output driver of channel 1 is tied to pin 7, whereas internal output driver of channel 2 is connected to pin 10. Resistors 308, 310 are pull up resistors for generating the independent drive signals for channels one and two, respectively, from their open collector output pins 7, 10.

Resistors 312, 315 divide the reference voltage by one-half to create a 1.25V reference from the original 2.5V output on pin 16 of PWM controller 302. The 1.25V reference is the internal error-amp reference voltage, which is applied to the non-inverting inputs of each channel's error amps located on pins 3, and 14. Pin 3 is the non-inverting input of channel 1, and pin 14 is the non-inverting input of channel 2. Capacitors 316, 318 are de-coupling capacitors for the on-chip reference voltage of 2.5V.

Referring to FIG. 7B, the anti-thump circuit is comprised of capacitor 314 and resistor 317 and the feedback invertor formed by 319, 321, 323, 325, 327 and 329 for channel 1, and 313, 320, 322, 324, 326, and 328 for channel two. During power-up, the dead-time control inputs for both channels, pins 6 and 11, will see a 2.5V signal which will slowly decay towards zero. During this time, internal output drivers of PWM controller chip 302 will cause the output drive signals to be high. That in turn causes the lower FETs 330, 332 of each channel to be on keeping the voltage across the speaker at zero. When the dead-time control input decays after power up, the PWM will begin switching and its output pulse width will slowly increase at a controlled rate. Once pins 6 and 11 have fully discharged the control-loop formed by resistors 336, 340, 342, and capacitors 338, 344 and the internal amplifier (whose input pins are pins 3 and 4) will begin controlling channel 1. Likewise, for channel two the control-loop formed by resistors 346, 350, 352, and capacitors 348, 354 and the internal error amplifier (whose input pins are pins 13 and 14) will begin controlling channel 2. Since the lower FETs were grounded during start-up there was no voltage across the speaker. At the same time the PWM controller began switching slowly at a controlled rate, thus there was no thumping during turn-on.

The FET driver of the type manufactured by HARRIS SEMICONDUCTOR (Item No. HIP4081) can control four FETs independently. It has been configured to operate the half-bridge of FETs 360, 330 (Channel 1), and the half-bridge of FETs 362, 332 (Channel 2) independently of each other. Pin 6 of FET driver 358 is the input of channel 1 and pin 5 of FET driver 358 is the input of channel 2. When either of these inputs are high their corresponding lower FETs will be on. When either of these inputs are low, their corresponding upper FETs will be on.

For channel 1, any modulating input command at input pin J2, will cause the rectangular output waveform to modulate FET's 360 source and FET's 330 drain. The output filter formed by 364 and 366 will remove the carrier waveform and reconstruct the audio signal. The coupling capacitor 368 will block the DC component of the audio signal and couple only the AC component allowing elimination of the negative supply.

For channel 2, any modulating input command at J1, will cause the rectangular output waveform to modulate FET's 362 source and FET's 332 drain. The output filter formed by inductor 370 and capacitor 372 will remove the carrier waveform and reconstruct the audio signal. The coupling capacitor 374 will block the DC component of the audio signal and couple only the AC component allowing the elimination of the negative supply.

FET driver 358 has an internal dead-time circuit that prevents both upper and lower FETs from conducting simultaneously. This dead-time is set by resistors 380, 382. Capacitors 384, 386 improve THD of the amplifier eliminating noise injected into the FET driver 358 pins 8, 9. Diodes 388, 389, and capacitors 392, 390 form an external charge pump that supplies the upper FET with its gate drive signal. Resistors 394, 396, 398, 400 help dampen the gate drive signal. Capacitors 402 and 404 are FET driver's power supply decoupling capacitors.

Referring to FIG. 7C, linear regulator 412 which steps the 24V bus to 12V, supplying power to FET driver and the PWM controller. Capacitors 408 and 410 are decoupling capacitors for regulator 412.

What is claimed is:

1. An audio amplifier comprising:
(a) a first section having at least one audio signal input port to which a respective audio input signal to be amplified is applied;
(b) a second section having a first monolithic device forming an integrated circuit coupled to said respective audio input port to receive said respective audio input signal, coupled to at least one feedback network to receive a respective feedback signal from the respective output of said audio amplifier, and adapted to produce at least one Pulse Width Modulated square wave signal;
(c) a third section embodied in a second monolithic device forming a second integrated circuit having:
  (i) at least one Pulse Width Modulated square wave signal input port;
  (ii) at least two square wave signal output ports;
  (iii) at least two field effect transistor (FET) driver circuits connected to said respective Pulse Width Modulated square wave signal input port to receive a respective Pulse Width Modulated square wave signal and develop therefrom a respective square wave FET switching signal directed to a respective said square wave signal output port;
(d) a fourth section having at least one FET operated switching circuit with at least two FETs wherein each of said FETs is connected to a corresponding respective square wave signal output port, each said respective FET being operative in response to a respective said square wave FET switching signal being received on the respective said square wave signal output to which said respective FET connected to switch sequentially and produce therefrom as an output of each said respective FET operated switching circuit a respective amplified square wave signal; said fourth section being adapted for use in conjunction with a proscribed number of external power sources;
(e) a fifth section having:
  (i) at least one filter circuit connected to receive and filter said respective amplified square wave signal, and produce therefrom a respective continuous amplified audio signal;
  (ii) at least one audio speaker connected to receive said respective continuous amplified audio signal and produce a respective audible signal therefrom;
(f) said respective feedback network is coupled to said respective filter circuit and said respective audio input port for transmitting said respective feedback signal in which the formation of said respective Pulse Width Modulated square wave signal depends; and
wherein said first and second sections and the components thereof are embodied in a single integrated circuit adapted on its input side to receive said respective audio input signal and said respective feedback signal, and on its output side having connections to said respective FET switching circuit.

2. An audio amplifier claimed in claim 1, wherein:
(a) said proscribed number of power sources comprises a positive and negative power supply;
(b) said respective FET operated switching circuit comprises a half-bridge topology having:
  (i) a p-channel FET having a source, a drain, and a gate, the source being connected to said positive power supply, the drain being connected to said respective filter circuit, the gate being connected to receive said respective square wave FET switching signal;
  (ii) a n-channel FET having a source, a drain, and a gate, the source being connected to said negative power supply, the drain being connected to said respective filter circuit, the gate being connected to receive said respective square wave FET switching signal.

3. An audio amplifier claimed in claim 1, wherein:
(a) said proscribed number of power sources comprises a single positive power supply;
(b) said FET operated switching circuit comprises a full-bridge topology having:
  (i) a first and second n-channel FET having a respective source, drain and gate, the respective sources of said first and second n-channel FETs connected to said respective filter circuit, the respective drains connected to said positive power supply, the respective gates connected to receive said respective square wave FET switching signal;
  (ii) a third and fourth n-channel FET having a respective source, drain and gate, the respective sources of said third and fourth n-channel FETs connected to a ground plan, the respective drains connected to said respective filter circuit, the respective gates are connected to receive said respective square wave FET switching signal.

4. An audio amplifier claimed in claim 1, wherein:
(a) said proscribed number of power sources comprises a single positive power supply;
(b) said FET operated switching circuit comprises a half-bridge topology having first and second n-channel FETs having a respective source, drain and gate, wherein the drain of said first n-channel FET connected to said a single positive power supply, the source of said first FET and drain of said second FET coupled to said respective filter circuit, the respective gates said first and second FETs connected to receive said respective square wave FET switching signal;
(c) an output AC coupling capacitor coupled in series between said respective amplified square wave signal and said respective speaker.

5. An audio amplifier claimed in 4, wherein said AC coupling capacitor is coupled in circuit before said respective filter circuit.

6. An audio amplifier claimed in 4, wherein said AC coupling capacitor is coupled in circuit after said respective filter circuit.

7. An audio amplifier claimed in claim 1, wherein said respective filter comprises a inductance capacitor network.

8. A Class-D amplifier comprising:
(a) a first section having at least one signal input port to which a respective input signal to be amplified is applied;
(b) a second section comprising a power supply Pulse Width Modulated controller device as a first monolithic device forming an integrated circuit coupled to said respective input port to receive said respective input signal, coupled to at least one feedback network to receive a respective feedback signal from the respective output of said Class-D amplifier, and adapted to produce at least one Pulse Width Modulated square wave signal, the first monolithic device including an error amp coupled to the feedback signal and the input signal to produce an error signal responsive thereto;
(c) a third section embodied in a second monolithic device forming a second integrated circuit having:
  (i) at least one Pulse Width Modulated square wave signal input port;
  (ii) at least two square wave signal output ports;
  (iii) at least two field effect transistor (FET) driver circuits connected to said respective Pulse Width Modulated square wave signal input port to receive a respective Pulse Width Modulated square wave signal and develop therefrom a respective square wave FET switching signal directed to a respective said square wave signal output port;
(d) a fourth section having at least one FET operated switching circuit with at least two FETs wherein each said FET is connected to a corresponding respective square wave signal output port, each said respective FET being operative in response to a respective said square wave FET switching signal being received on the respective said square wave signal output to which said respective FET connected to switch sequentially and produce therefrom as an output of each said respective FET operated switching circuit a respective amplified square wave signal; said fourth section being adapted for use in conjunction with a proscribed number of external power sources; and
(e) wherein said respective feedback network is coupled to said respective amplified square wave signal.

9. A Class-D amplifier according to claim 8 further comprising a fifth section having:
  (i) at least one filter circuit connected to receive and filter said respective amplified square wave signal, and produce therefrom a respective continuous amplified signal;
  (ii) an output device connected to receive said respective continuous amplified signal.

10. A Class-D amplifier according to claim 9 wherein:
(a) said proscribed number of power sources comprises a positive and negative power supply;
(b) said respective FET operated switching circuit comprises a half-bridge topology having:
  (i) a p-channel FET having a source, a drain, and a gate, the source being connected to said positive power supply, the drain being connected to said respective filter circuit, the gate being connected to receive said respective square wave FET switching signal;
  (ii) a n-channel FET having a source, a drain, and a gate, the source being connected to said negative power supply, the drain being connected to said respective filter circuit, the gate being connected to receive said respective square wave FET switching signal.

11. A Class-D amplifier according to claim 9, wherein:
(a) said proscribed number of power sources comprises a single positive power supply;
(b) said FET operated switching circuit comprises a full-bridge topology having:
  (i) a first and second n-channel FET having a respective source, drain and gate, the respective sources of said first and second n-channel FETs connected to said respective filter circuit, the respective drains connected to said positive power supply, the respective gates connected to receive said respective square wave FET switching signal;
  (ii) a third and fourth n-channel FET having a respective source, drain and gate, the respective sources of said third and fourth n-channel FETs connected to a ground, the respective drains connected to said respective filter circuit, the respective gates connected to receive said respective square wave FET switching signal.

12. A Class-D amplifier according to claim 9, wherein:
(a) said proscribed number of power sources comprises a single positive power supply;
(b) said FET operated switching circuit comprises a half-bridge topology having first and second n-channel FETs having a respective source, drain and gate, wherein the drain of said first n-channel FET is connected to said single positive power supply, the source of said first FET and drain of said second FET coupled to said respective filter circuit, the respective gates of said first and second FETs connected to receive said respective square wave FET switching signal;

(c) an output AC coupling capacitor coupled in series between said respective amplified square wave signal and said respective output device.

13. A Class-D amplifier according to claim 12, wherein said AC coupling capacitor is coupled in circuit before said respective filter circuit.

14. A Class-D amplifier according to claim 12, wherein said AC coupling capacitor is coupled in circuit after said respective filter circuit.

15. A Class-D amplifier according to claim 8 further comprising an anti-thump circuit coupled to the first monolithic device and the amplified square wave signal.

16. A Class-D amplifier according to claim 15 wherein the first monolithic device includes a DTC control input and wherein the anti-thump circuit is connected to the DTC control input.

17. A Class-D amplifier according to claim 16 wherein the anti-thump circuit inverts the amplified square wave signal.

* * * * *